United States Patent [19]

Wilson

[11] Patent Number: 4,670,860

[45] Date of Patent: Jun. 2, 1987

[54] INFORMATION HOLDING DEVICE

[75] Inventor: Edward G. Wilson, London, England

[73] Assignee: QMC Industrial Research Limited, London, England

[21] Appl. No.: 719,876

[22] Filed: Apr. 4, 1985

[30] Foreign Application Priority Data

Apr. 6, 1984 [GB] United Kingdom ............... 8409022

[51] Int. Cl.$^4$ .............................................. G11C 13/00
[52] U.S. Cl. ..................................... 365/106; 365/107
[58] Field of Search ................. 365/106, 107; 357/6, 357/8

[56] References Cited

U.S. PATENT DOCUMENTS 3,935,493  1/1976  Browwer ...................... 365/106 X
4,534,015  8/1985  Wilson ............................. 365/106

Primary Examiner—Joseph A. Popek
Attorney, Agent, or Firm—McAulay, Fields, Fisher, Goldstein & Nissen

[57] ABSTRACT

A memory for carrying information comprises a multi-layer film having a plurality of monomolecular layers, in which each layer is capable of carrying a charge. Charges are introduced into one side of the film in a time sequence which corresponds to the information to be carried. A voltage is applied between the faces of the film to cause the charge carried by any layer to be transferred to the adjacent layer. The sequence of charges carried by the film can be read out. The charges are introduced by electrodes adjacent opposite faces of the film which apply across the film voltage pulses of an amplitude greater than that required to cause tunnelling without thermal activation between the layers of the film and at least equal to that required to cause electrons to tunnel without thermal activation from one of the electrodes to the film layer adjacent thereto.

9 Claims, 4 Drawing Figures

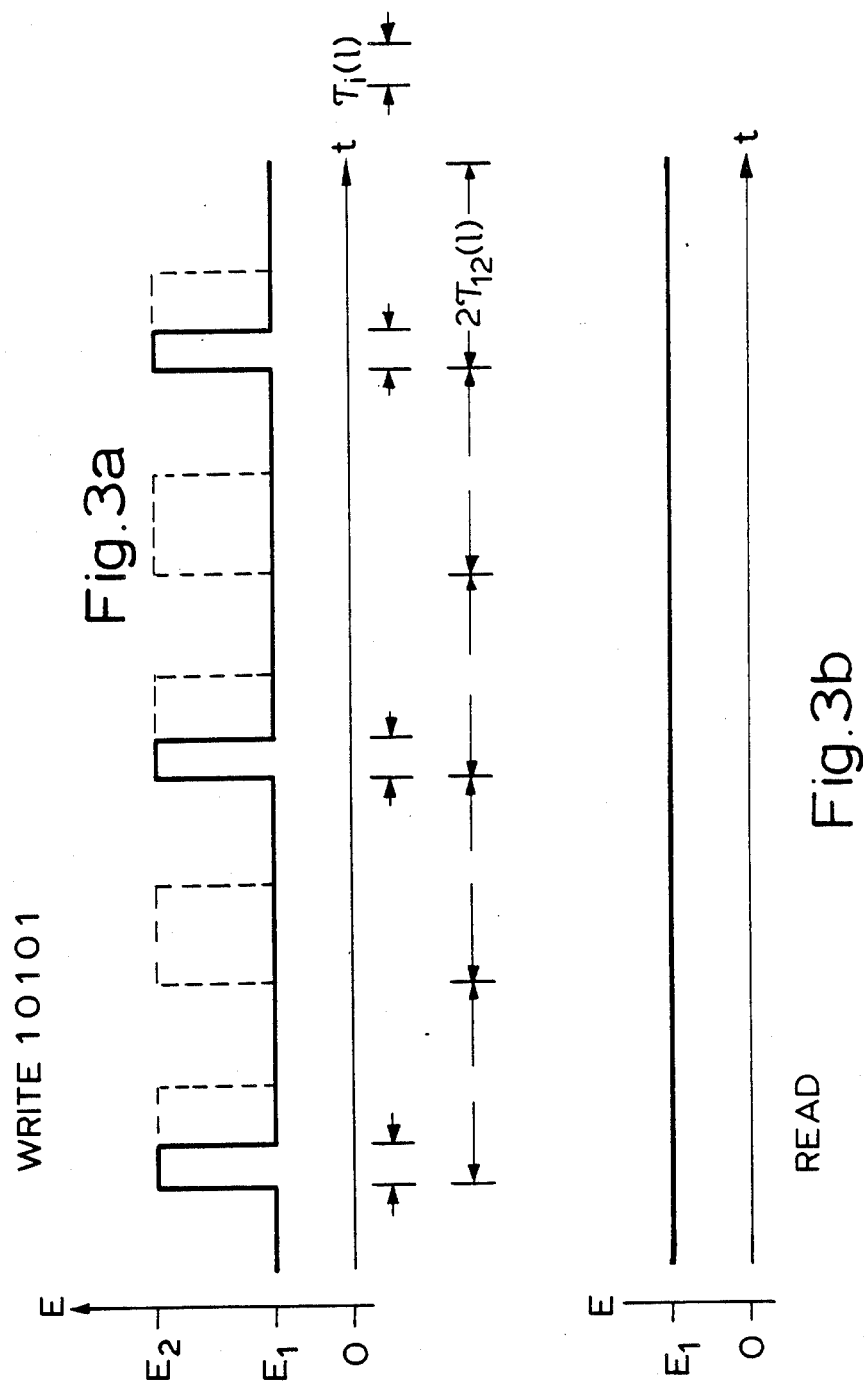

INFORMATION HOLDING DEVICE

FIELD OF INVENTION

This invention relates to an information holding device. The device is referred to below as a memory, though it is to be understood that the information may be held only briefly, in which case the device may function, for example, as a delay line, or the information may be held for a longer time, in which case the device may function as a normal memory.

BACKGROUND OF THE INVENTION

European Patent Specification EP No. 0077135A corresponding to U.S. Pat. No. 4,534,015 and copending European Patent Application No. 84301981.1 corresponding to U.S. Ser. No. 591,939, now U.S. Pat. No. 4,627,019 describe memories employing a film comprising a plurality of monomolecular layers. In the case of EP No. 0077135A the film is described as being formed by the Langmuir-Blodgett technique, and in the case of the European Patent Application at least one of the layers is formed by a process of chemisorption. In these memories each layer is capable of carrying a charge. A charge injector is located on one side of the film for introducing charges into the film in a time sequence which corresponds to the information to be carried. Means are provided for applying a voltage between the faces of the film to cause the charge carried by any larger to be transferred to the adjacent layer. The sequence of charges carried by the film may be read out by a photon-emitting electron arrival detector or by a method of current differentiation. At least some of the layers of the film are preferably formed of a polydiacetylene (PDA), though other materials may be used, for example a porphyrin.

The charge injector described in the above mentioned specification and application takes the form of a photoinjector layer which injects charge into the adjacent film layer in response to incident photons. The present invention provides a memory of the same type as that described in the above-mentioned European specification and application (the disclosures of which are incorporated herein by reference) but with a charge injector which does not require a source of photons.

BRIEF SUMMARY OF THE INVENTION

According to the present invention there is provided a memory for carrying information, comprising a multilayer film comprising a plurality of monomolecular layers and in which each layer is capable of carrying a charge; means for introducing charges into one side of the film in a time sequence which corresponds to the information to be carried; means for applying a voltage between the faces of the film to cause the charge carried by any layer to be transferred to the adjacent layer; and means for reading out the sequence of charges carried by the film; wherein the charge introducing means comprises electrodes adjacent opposite faces of the film and means for applying across the film voltage pulses of an amplitude greater than that required to cause tunnelling without thermal activation between the layers of the film and at least equal to that required to cause electrons to tunnel without thermal activation from one of the electrodes to the film layer adjacent thereto.

BRIEF DESCRIPTION OF THE DRAWINGS

FIGS. 3a and 3b show respectively the voltage signals for writing and reading.

DESCRIPTION OF PREFERRED EMBODIMENT

Figure 1:
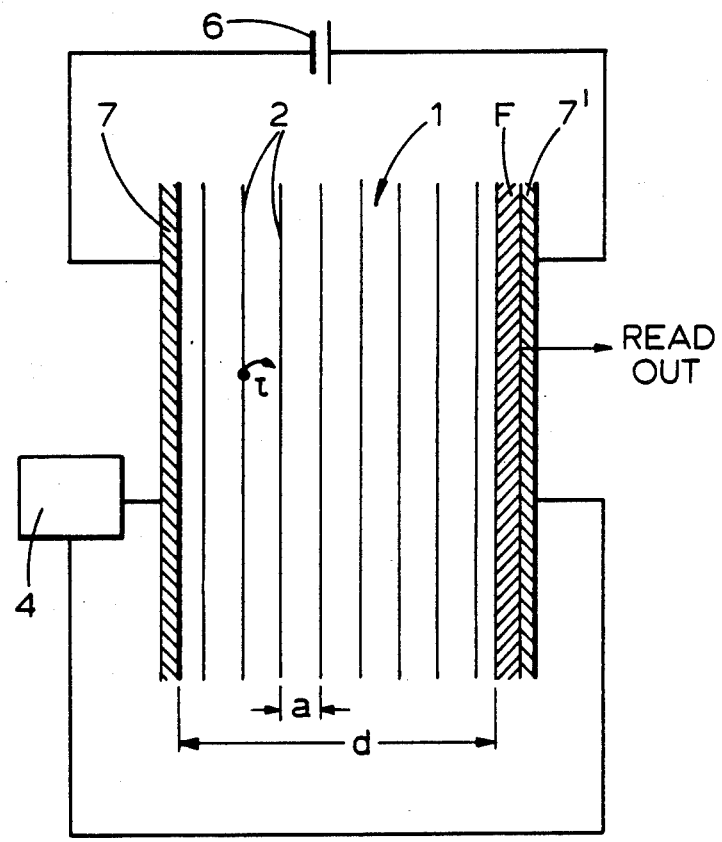
FIG. 1 shows diagramatically one embodiment of a memory according to the present invention. For a description of alternative memories to which the present invention can be applied reference is directed to EP No. 0077135A and to the above mentioned European Patent Application.

The embodiment shown in FIG. 1 comprises a film 1 formed of a plurality of n monomolecular layers 2 (eight are illustrated). The layers are alternately of different materials to enable a charge pattern injected into the layers to be frozen therein. In this connection particular attention is directed to EP No. 0077135A and the description with reference to FIGS. 4a and 4b thereof, which discloses a memory wherein the film is composed of layers of at least two materials having different electron affinities, at least one of the materials being sandwiched between adjacent layers, or groups of layers, of the other of the materials. The layers are spaced a distance a apart from one another and the overall film thickness is d. Adjacent opposite faces of the film 1 are electrodes 7 and 7' via which a d.c. voltage can be applied across the film from a voltage source 6. The electrodes also enable a voltage pulse train, the pulses of which represent the information to be stored, to cause electrons to be injected into the film from a pulse source 4 via the electrode 7. Adjacent one face of the film 1 is a layer F of molecules which fluoresce on receiving an electron.

In operation of the above described device the pulse source 4 causes electrons to be injected into the film layer adjacent the electrode 7 in a time sequence which corresponds to the information to be stored. The electrons are caused to jump from one plane to the next by the voltage from the d.c. source 6. Because of the synchronism between the period of the pulse train and the jump time for an electron to jump from one plane to the next the pulse train is translated into a corresponding spatial charge distribution across the film. Thus, for example, if the pulse train emitted by the source 4 is 10011010 then after a time equal to t has elapsed there will be a corresponding charge distribution 10011010 across the thickness of the film 0 and 1 corresponding respectively to the absence and presence of charge on an individual layer of the film.

It is to be understood that although the description of the drawing refers only to a single electron on a particular layer there would in practice be a group of electrons.

Figure 2:
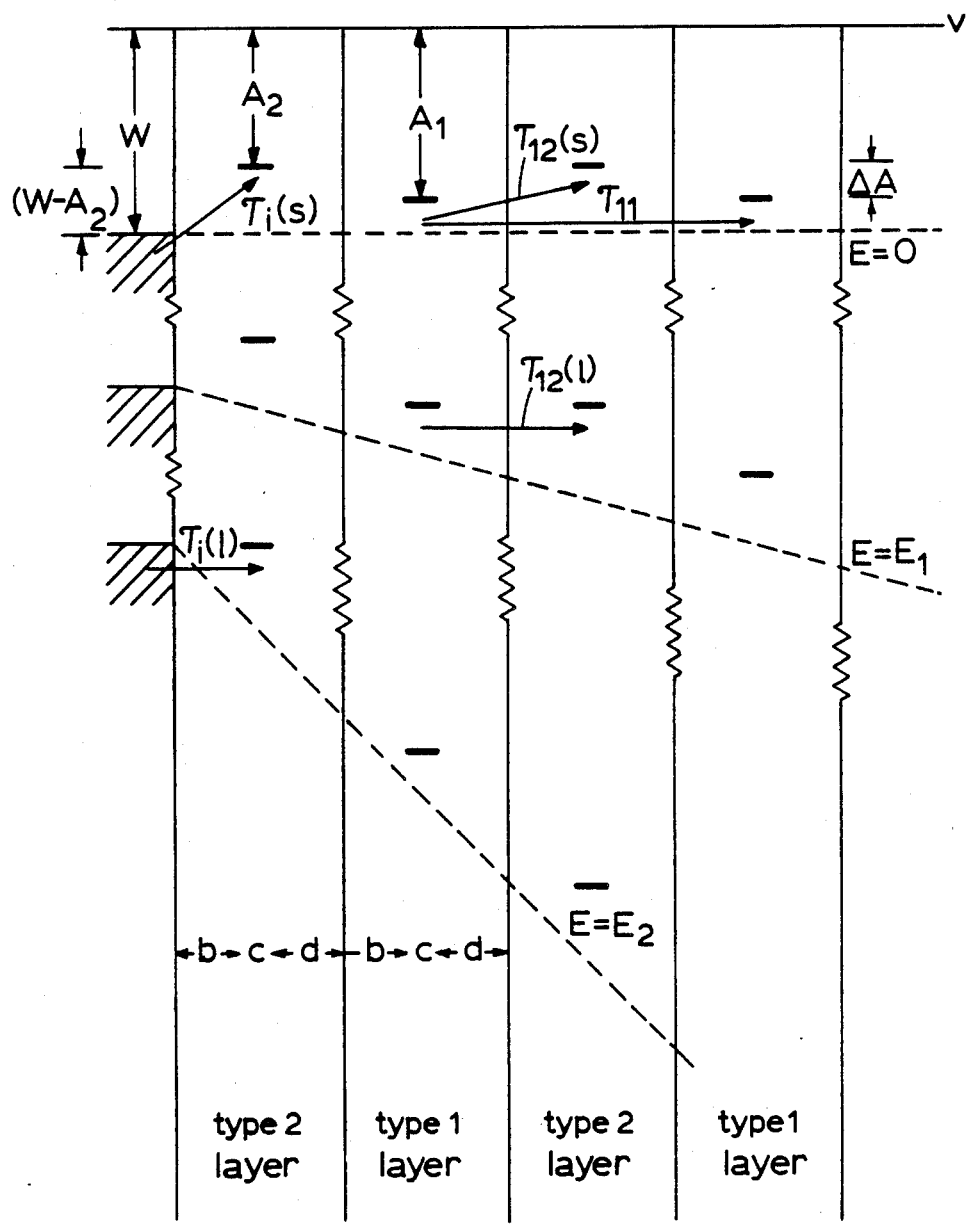
FIG. 2 shows a portion of a memory according to the present invention with relevant energy levels indicated thereon.

The method of charge injection will now be described in more detail with reference to FIG. 2, 3a and 3b. FIG. 2 shows in detail the layer structure adjacent to a metal or semi-conducting electrode 7. It draws attention to the fact that within each layer is a conjugated region c, i.e. a region of conjugated unsaturation, and non-conjugated regions b and d i.e. $a = b + c + d$. For example in a PDA layer the conjugated region is the backbone of the molecule and the two non-conjugated regions are the side groups; in a porphyrin layer the conjugated region is enclosed by an outer conjugated ring and the non-conjugated regions are side groups attached to that ring. The regions b and d are indicated as being of approximately equal size but this need not be so.

The minimum read field is $E_1$. It is the field required to equalise the energy levels on adjacent film layers so that tunnelling occurs between the layers without thermal activation. This is the minimum field which must be applied by voltage source 6.

It is easy to arrange that at the field $E_1$ the voltage across the device is sufficiently great that the adjacent bits do not diffuse together in one transit across the device.

The field $E_2$ is the minimum write field. This is the field required to equalise the energy levels of an electron in the electrode 7 and an electron on the first film layer. Then tunnelling injection of electrons can occur without thermal activation. It is easy to arrange that $E_2$ is greater than $E_1$ (see below).

FIG. 3a shows the timing of the write field across the multilayer structure to give controlled injection of charge. The pulse train shown is that required to write 10101 into the memory. The raising of the field to $E_2$ does not affect the motion of the electrons already in the layers, for at the field $E_1$ they are already travelling across the device at their maximum rate.

As mentioned above, the film is formed of alternate layers of different materials labelled in FIG. 2 as type 1 and type 2. FIG. 2 also contains the following symbols which are listed below with their meanings.

$\tau_{12}(S)$: electron jump time between adjacent layers in zero field $\tau_{12}(l)$: electron jump time between adjacent layers in field $E \geq E_1$.

$\tau_i(S)$: electron injection jump time (i.e. the time for an electron to tunnel from the electrode to the first film layer) in zero field.

$\tau_i(l)$: electron injection jump time in field $E \geq E_2$.

$\tau 11$: electron jump time between one layer of type 1 and a next adjacent layer of type 1.

$A_1$: electron affinity of layer of type 1.

$A_2$: electron affinity of layer of type 2.

$\Delta A$: equal to $A_1 - A_2$.

v: reference energy of an unbound electron at rest.

W: energy of the Fermi level of the electrodematerial (if metal) or the valence band edge of the electrode material (if a semiconductor).

It can be shown that $$E_1 = \Delta A/e(b+d)$$

and $$E_2 = (W - A_2)/eb$$

where e is the electron charge. The values of $\Delta A$, $A_2$, W, b+d can readily be chosen to be such that $E_2 > E_1$, which is a requirement for the device to operate. For most materials which one might use $\tau_i(l) < \tau_{12}(l)$. So that the time needed to inject one bit into one layer is less than the time for the bits to be transferred fromone layer to another. If this is not the case, however, one can still operate the device by using a longer injection time and associating each bit with two or more layers.

Although the above description refers mainly to memories in which the bits are frozen by the use of alternating layers of different materials, it must be understood that the present invention and the electronic injection feature thereof are equally applicable to memories where the bits are not frozen but are cycled or simply transit through the memory.

Also, it is to be noted that $E_1$ and $E_2$ are the minimum read and write fields and in practice both would normally be higher than the minimum values, with the read field being greater than $E_1$ but less than $E_2$.

What is claimed is:

1. A memory for carrying information comprising a multilayer film comprising a plurality of monomolecular layers in which each layer is capable of carrying a charge; means for introducing charges into one side of the film in a time sequence which corresponds to the information to be carried; means for applying a voltage between the faces of the film to cause the charge carried by any layer to be transferred to the adjacent layer; and means for reading out the sequence of charges carried by the film; wherein the charge introducing means comprising electrodes adjacent opposite faces of the film and adapted to be connected to a voltage source for applying across the film voltage pulses to create fields of an amplitude greater than that required to cause tunnelling without thermal activation between the layers of the film and at least equal to that required to cause electrons to tunnel without thermal activation from one of the electrodes to the film layer adjacent thereto.

2. A memory according to claim 1, wherein the film is a Langmuir-Blodgett film.

3. A memory according to claim 1, wherein the layers of the film are formed of polymeric material.

4. A memory according to claim 3, wherein each layer of the film has an inner region of conjugated unsaturation and outer regions, on eigher face of the inner region, which are non-conjugated.

5. A memory according to claim 4, wherein at least some of the layers of the film are formed of a polydiacetylene.

6. A memory according to claim 4 wherein at least some of the layers of the film are formed of a porphyrin.

7. A memory according to claim 1, wherein at least one of the said electrodes comprises a layer of a semiconductor.

8. A memory according to claim 1, wherein at least one of the said electrodes comprises a layer of a metal.

9. A memory according to claim 1, wherein the film is composed of layers of at least two materials having different electron affinities, at least one layer of one of the materials being sandwiched between adjacent layers, or groups of layers, of the other of the materials.

* * * * *